(12) United States Patent
Yang

(10) Patent No.: US 6,329,248 B1
(45) Date of Patent: Dec. 11, 2001

(54) METHOD FOR MAKING SPLIT GATE FLASH MEMORY CELLS WITH HIGH COUPLING EFFICIENCY

(75) Inventor: Yu-Hao Yang, Hsinchu (TW)

(73) Assignee: Winbond Electronics Corp, Hsinchu (TW)

( * ) Notice: Subject to any disclaimer, the term of this patent is extended or adjusted under 35 U.S.C. 154(b) by 0 days.

(21) Appl. No.: 09/528,515

(22) Filed: Mar. 20, 2000

Related U.S. Application Data

(62) Division of application No. 09/113,032, filed on Jul. 9, 1998, now Pat. No. 6,093,945.

(51) Int. Cl.$^7$ ................................................. H01L 21/8247
(52) U.S. Cl. .......................... 438/267; 438/304; 438/596
(58) Field of Search ..................................... 438/257, 259, 438/266, 267, 304, 596

(56) References Cited

U.S. PATENT DOCUMENTS

| | | | |
|---|---|---|---|
| 5,270,234 | * 12/1993 | Huang et al. | 438/305 |
| 5,374,575 | * 12/1994 | Kim et al. | 438/305 |
| 5,538,913 | * 7/1996 | Hong | 438/304 |
| 5,600,168 | * 2/1997 | Lee | 438/304 |
| 5,705,415 | * 1/1998 | Orlowski et al. | 438/267 |

FOREIGN PATENT DOCUMENTS

19612676 * 10/1997 (DE) .................................................

* cited by examiner

Primary Examiner—Chandra Chaudhari
(74) Attorney, Agent, or Firm—W. Wayne Liauh

(57) ABSTRACT

A process for making split-gate semiconductor flash memory contains an outwardly-diverging control gate stacked on but separated from a pair of opposing floating gates via an interpoly dielectric layer. This process includes the steps of: (a) forming a first dielectric layer having a trench region on a substrate; (b) forming a tunnel oxide layer in the trench region; (c) forming a first polysilicon layer covering the first dielectric layer and the tunnel oxide layer; (d) applying an anisotropic etching technique on the first polysilicon layer to form a pair of opposing polysilicon sidewall spacers on the sidewalls which will eventually become floating gates; (e) depositing an inter-poly dielectric layer on the polysilicon sidewall spacers and the tunnel oxide layer; (f) filling the channel area between the pair of polysilicon sidewall spacers with a second polysilicon layer; (g) planarizing the second polysilicon layer so that relative to the first dielectric layer to form a control gate; (h) removing the first dielectric layer, capping the control gate and the floating gate with a final oxide layer, and forming source and drain regions in the substrate using ion implantation. The split-gate flash memory eliminates the over-erase problem experienced with the self-aligned ETOX flash memory cells, while allowing its cell dimension to maintain at least the same using the conventional photolithography technique.

7 Claims, 4 Drawing Sheets

METHOD FOR MAKING SPLIT GATE FLASH MEMORY CELLS WITH HIGH COUPLING EFFICIENCY

This is a divisional application of application Ser. No. 09/113,032 filed on Jul. 9, 1998, now U.S. Pat. No. 6,093,945.

FIELD OF THE INVENTION

The present invention relates to flash memory cells with a split gate architecture and the method of fabricating the same. More specifically, the present invention relates to a self-aligned stacked gate flash memory cell with improved coupling efficiency between the control gate and the floating gate, and method for fabricating the same. One of the main advantages of the novel method disclosed in the present invention is that fine line control of the gate region and higher cell current can be achieved with conventional photolithography technique, whereas the coupling efficiency between the control gate and the floating gate can be maintained at the same level as the conventional ETOX (electron tunnel oxide) flash memory cells or better. The method disclosed in the present invention allows the dimensional precision requirement to be relaxed during fine gate patterning steps. As a result, the resultant flash memory provides improved performance at reduced size and without incurring substantially increased manufacturing cost.

BACKGROUND OF THE INVENTION

Flash memories are high-density nonvolatile semiconductor memories offering fast access times. Compared to other nonvolatile semiconductor memories such as EPRPMs or EEPROMs, flash memories are most suitable for applications wherein frequent write and read operations are expected. With the rapid growth of digital cameras and the desire for light-weight notebook PCs, the demand for flash memories even higher densities are ever increasing.

Currently, flash memories are often made by the conventional self-aligned ETOX (electron tunnel oxide) technology. However, it has been observed that the ETOX flash memories can experience an over-erase problem, which results in an increased negative threshold voltage after the erase operation, if the erase operation is not properly designed or if its is improperly performed. When such over-erase problem occurs, positive charges will accumulate under the floating gate, causing the cell threshold voltage to become more negative. Furthermore, when over-erase occurs, cells that are affected will be normally ON during the standby state after erase, causing higher standby or leakage current in the cells.

In order to overcome this problem, several erase schemes and cell structures have been proposed. One of the most promising designs is to use a split gate structure to avoid the over-erase problem in flash memory operation.

FIG. 1 is an illustrative schematic diagram showing the structure of a conventional split gate cell. One of the advantages of a split gate cell is that one part of the channel is controlled by the control gate directly, and the other part is controlled by the floating gate, thus the name split-gate is obtained. When the over-erase occurs in the floating gate, only the portion of the channel under the floating gate will be normally ON and the portion of the channel underneath the control gate remains unaffected. Since the two channels underneath the floating gate and the control gate, respectively, are connected in series, the cell threshold voltage can be maintained positive without introducing large standby current.

FIGS. 2A through 2C schematically show the main steps of the process of fabricating split gate flash memory. FIG. 2A shows that, after field oxidation, a tunnel oxide 1 is grown on a substrate 10, followed by the deposition of first polysilicon layer 2. Then, an inter-poly dielectric layer 3 is formed on the first polysilicon layer 2, which is followed by the deposition of the second polysilicon layer 4.

FIG. 2B shows that a control gate pattern is defined and the second polysilicon layer 4 is etched with the aid of a photoresist 5 to form the control gate 6. FIG. 3C shows that, after the control gate 6 is formed, a second polysilicon etch, which is self-aligned to the control gate, is applied to etch the remaining first polysilicon layer 2 exposed on the substrate surface to form a floating gate 7. This forms a split gate structure comprising a floating gate 7 and a control gate 6 both are formed on the substrate 10 above the tunnel oxide 1 and separated by an inter-poly dielectric layer 3. After source/drain implantation to form source 8 and drain 9, a split gate device is formed as shown in FIG. 1.

One of the main drawbacks of split-gate memories is that, because of the need for the addition channel required to provide direct control for the control gate, under the conventional technology, their size will be about 50% greater than that of the self-aligned ETOX flash memory cell. In order to minimize the increase in the cell size, it is highly desirable to make floating gate as short as possible. However, the minimum length of the floating gate is dictated by the dimensional precision of the photolithography technology. Using the conventional photolithography technology, the size of the split-gate cells cannot be scaled down to the same extent as that of the self-aligned ETOX flash memory cells. Moreover, during the process stop of self-aligned etching of the first polysilicon layer to form the floating gate, extensive over-etch may occur on the region that is not covered by the first polysilicon layer, resulting in possible silicon attack. To avoid such over-etch problem, a stricter process requirement such as extremely high oxide to silicon selectivity is often required for the floating gate etch. This leads to substantially reduced process margins (i.e., rooms for error), reduced yield rate, and increased process cost.

Several prior art processes maybe utilized to prepare split-gate semiconductors with reduced dimensions. They are briefly summarized below. U.S. Pat. No. 5,270,234 discloses a method for fabricating deep submicron transistors which employs only optical lithography and involves the formation of a relative wide aperture using optical techniques. In the process disclosed in the '234 patent, an aperture is formed in a polished layer having a dimension that is considerably larger than the final channel width and within the limits of the lithography. Sidewalls are formed within the aperture in a controllable manner to determine the final channel width of the transistor. The thickness of the sidewalls is maintained during the fabrication process by the use of a two-component sidewall and a selective etch, so that the etching process that determines the final channel dimension does not change the sidewall thickness. The process disclosed in the '234 may have some technical but it is relatively complicated and may not be cost effective.

U.S. Pat. No. 5,374,575 discloses a method for fabricating LDD MOS transistors having a lightly doped drain structure capable of simplifying the fabrication and improving characteristics of the transistor. In a highly integrated system, such as the submicron system, a high electric field may occur at edge portions of the gate electrode causing the generation of hot carriers. The hot carriers serve to degrade the operation characteristic of MOS transistors and reduce the life thereof. The '375 illustrates the importance of having a well defined dimension for the gate electrode; however, it does not teach or suggest method which will allow MOS manufacturers to relax the dimensional precision requirement of lithophotography technique when fabricating submicron MOS transistors.

U.S. Pat. No. 5,538,913 discloses a process for fabricating submicron MOS transistor devices with a full-overlap lightly-doped drain. With the process disclosed in the '913 patent, the gate electrode comprises a conducting layer and a pair of conducting sidewall spacers, and a p-type diffusion region is formed by ion implantation between and below the pair of conducting sidewall spacers to prevent punch-through of the channel region. The MOS transistor fabricated from the '913 has a gate electrode of uniform width.

Because of the importance of flash memories in consumer electronics, it is highly desirable that an improved method be developed which will be able to utilize the currently existing technology so as to allow IC manufacturers to fabricate flash memories with improved performance and reduced size while deferring the need for expensing new capitals.

SUMMARY OF THE INVENTION

The primary object of the present invention is to develop improved flash memories which will be free from the over-erase problem experienced with self-aligned ETOX flash memories but which will not result in a substantial increase in the cell dimension, as experienced with the conventional split-gate flash memory cells. More specifically, the primary object of the present invention is to develop a method by which the conventional photolithography techniques can be used for fabricating split-gate flash memory cells which will avoid the over-erase problem often experienced with the self-aligned ETOX flash memory cells without subjecting to the penalty of increased cell dimension. The novel split-gate flash memory cells fabricated from the process disclosed in the present invention exhibit the same or better coupling efficiency between the floating gate and control gate relative to the self-aligned ETOX flash memory cells, while eliminating the over-erase problems that have been associated therewith.

One of the main characteristics of the split-gate flash memory cells fabricated from the process of the present invention is that its control gate has a novel "outwardly diverging" configuration which is stacked on a pair of opposing floating gates, from which the control gate is respectively separated by an inter-poly dielectric layer. The implementation of the pair of opposing floating gates, which also collectively form a mirror-imaged outwardly-diverging configuration, allows the control gate of the flash memory to be formed to have a relatively short length using conventional photolithography technique. This novel approach allows the size of the split-gate flash memory cell of the present invention to be in the same level as that of the conventional self-aligned ETOX cells.

The process disclosed in the present invention contains the following steps:

(a) Preparing a semiconductor substrate having a pad oxide layer thereon.

(b) Depositing a first dielectric layer, such as oxide, polysilicon, or silicon nitride, on the pad oxide layer. The first dielectric layer can have a thickness ranging from 10 nm to 1 $\mu$m. A photomask region is defined using conventional photolithography technique which will correspond to the designed active channel region. The dielectric layer is then etched to reveal a channel region which lies below the etched region, or the trench region. The width of the trench region can be from 1 nm to 5 $\mu$m and is formed wider than the width of the control gate to be ultimately formed.

(c) Growing and etching a sacrificial oxide layer then growing a tunnel oxide layer in the trench region having a thickness ranging from 1 nm to 50 nm. Thereafter, a first polysilicon layer is deposited covering the first dielectric layer and the tunnel oxide layer. The thickness of the polysilicon layer ranges from 1 nm to 50 $\mu$m.

(d) After the first polysilicon layer is deposited, applying anisotropic etch on the first polysilicon layer to form a pair of opposing polysilicon sidewalls spacers adjacent the sidewalls of the first dielectric layer. The polysilicon sidewall spacers cover the end portions of the channel and will form the floating gates of the flash memory cell.

(e) Depositing or growing a thin gate oxide layer on the polysilicon sidewall spacers and above the channel portion between the polysilicon sidewall spacers. This gate oxide layer will become an inter-poly dielectric layer.

(f) Filling the empty region between the first polysilicon layer (i.e., the pair of polysilicon sidewall spacers) with a second polysilicon layer having a thickness from 1 nm to 5 $\mu$m; the second polysilicon layer between the polysilicon sidewall spacers will eventually form the control gate.

(g) Using a chemical-mechanical polishing or anisotropic dry etch technique to remove portion of the second polysilicon layer above the surface formed by the first dielectric layer and an outwardly diverging control gate stacked on the pair of matching floating gates and separated by the inter-poly dielectric layer is formed.

(h) Selectively removing the first dielectric layer, leaving the channel area (which includes the control gate and the floating gate) on the substrate. As a result, a fully self-aligned split gate structure is formed.

Finally, an outermost oxide layer is then deposited or grown to cap the channel area, and a conventional ion implantation technique is applied, using the outermost oxide layer as a mask, to form source and drain regions, respectively. Thus, a new and improved split-gate flash memory having a pair of floating gates at both sides of control gate is formed which exhibits improved coupling efficiency between floating gate and control gate and eliminates the over-erase problem experienced in the prior art devices without incurring increased cell dimension is obtained, using the conventional photolithography technique.

BRIEF DESCRIPTION OF THE DRAWING

The present invention will be described in detail with reference to the drawing showing the preferred embodiment of the present invention, wherein:

FIG. 2A shows that, after field oxidation, a tunnel oxide is grown on a substrate, followed by the deposition of the first polysilicon layer. Then, an inter-poly dielectric layer is formed on the first polysilicon layer, which is followed by the deposition of the second polysilicon layer.

FIG. 2B shows that a control gate is defined and the second polysilicon layer is etched with the aid of a photoresist to form the control gate.

FIG. 2C shows that, after the control gate is formed, a second polysilicon etch, which is self-aligned to the control gate, is applied to etch the remaining first polysilicon layer exposed on the substrate surface to form a floating gate.

FIG. 3A is a schematic drawing shows that a first dielectric layer having a trench region which will subsequently define a channel area is formed on the substrate using conventional photolithography technique.

FIG. 3B is a schematic drawing showing that a tunnel oxide layer is grown in the trench region, followed by the deposition of a first polysilicon layer which covers the first dielectric layer and the tunnel oxide layer.

FIG. 3C is a schematic drawing showing that a pair of opposing polysilicon sidewall spacers are formed respectively adjacent to the sidewalls of the first dielectric layer using anisotropic etch technique.

FIG. 3D is a schematic drawing showing that a gate oxide layer is formed on the polysilicon sidewall spacers and above the portion of the channel area between the polysilicon sidewall spacers which will become the inter-poly dielectric layer, followed by the filling of the channel region between the first polysilicon layer (i.e., the pair of polysilicon sidewall spacers) with a second polysilicon layer which will eventually form the control gate.

FIG. 3E is a schematic drawing showing that the second polysilicon layer has been planarized to the same level as the first dielectric layer using a chemical-mechanical polishing or anisotropic dry etch technique, leaving an outwardly diverging control gate stacked on the pair of matching floating gates and separated by the inter-poly dielectric layer.

FIG. 3F is a schematic drawing showing that a split-gate flash memory cell of the present invention has been formed by first selectively removing the first dielectric layer and leaving the channel area on the substrate, then depositing or growing an outermost oxide layer to cap the channel area, and finally using a conventional ion implantation technique, using the outermost oxide layer as a mask, to form source and drain regions, respectively.

DETAILED DESCRIPTION OF THE PREFERRED EMBODIMENT

The present invention discloses improved flash memories which are free from the over-erase problems experienced with the self-aligned ETOX (electron tunnel oxide) flash memories but which will not incur a substantial increase in the cell dimension, as experienced with the conventional split-gate flash memory cells. Also disclosed in the present invention is a novel method for fabricating split-gate flash memory cells by which the conventional photolithography techniques can be used and the flash memories so fabricated will eliminate the over-erase problem often experienced with the self-aligned ETOX flash memory cells without being subject to the penalty of increased cell dimension.

Figure 1:
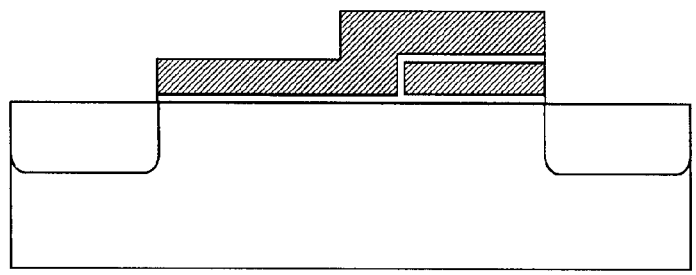
FIG. 1 is a schematic drawing a split-gate flash memory cell prepared using the conventional method.
Figure 2A:
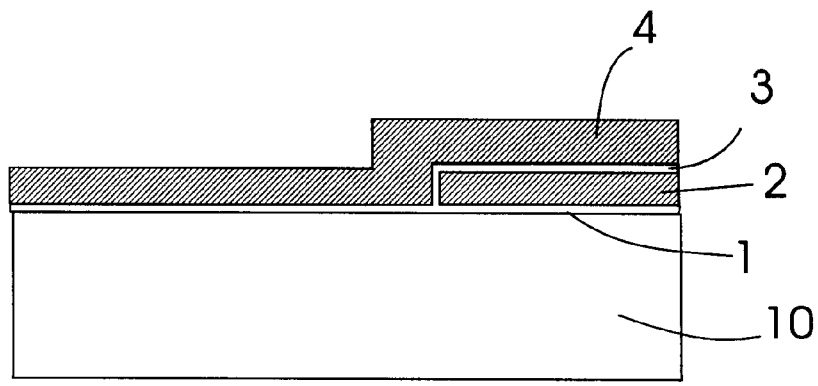
FIGS. 2A–2C are schematic drawings showing the main steps of forming the split-gate flash memory cell using the conventional method.
Figure 2B:
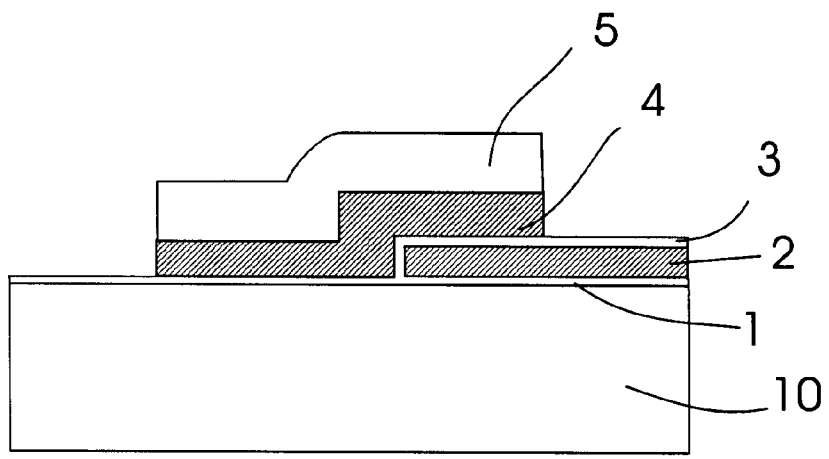
Figure 2C:
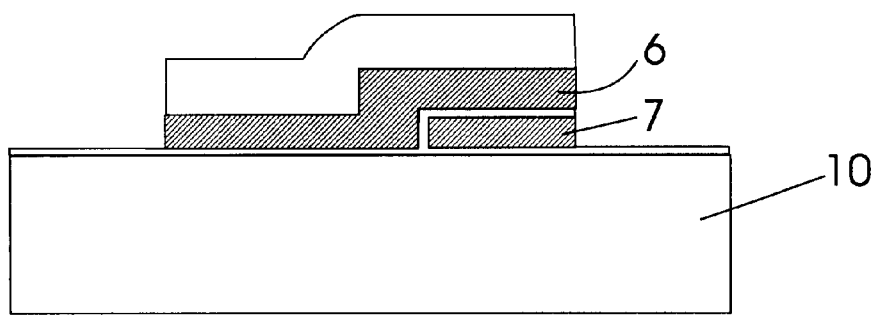

FIGS. 2A through 2C schematically show the main steps of the process of fabricating split gate flash memory according to the prior art method. As discussed before, FIG. 1 is an illustrative schematic diagram showing the structure of a conventional split gate cell. The split gate cell provides the advantage that one part of the channel is controlled by the control gate directly, and the other part is controlled by the floating gate; thus, when the over-erase occurs in the floating gate only the portion of the channel under the floating gate can be normally ON and the portion of the channel underneath the control gate remains unaffected. Since the two channels underneath the floating gate and the control gate, respectively, are connected in series, the cell threshold voltage can be maintained positive without introducing large standby current.

However, as it was discussed, under the conventional photolithography technology, the size of a split-gate cell can be about 50% greater than that of self-aligned ETOX flash memory cell, because of the need to provide the addition channel required to provide direct control for the control gate. While it is highly desirable to make floating gate as short as possible, the minimum length of the floating gate is limited by the dimensional precision of the photolithography technology. Using the conventional photolithography technology, the size of the split-gate cells cannot be scaled down to the same extent as the self-aligned ETOX flash memory cells. Moreover, during the process stop of self-aligned etching of the first polysilicon layer to form the floating gate, extensive over-etch may occur on the region that is not covered by the first polysilicon layer, resulting in possible silicon attack. To avoid such over-etch problem, a stricter process requirement such as extremely high oxide to silicon selectivity is often required for the floating gate etch. This leads to substantially reduced process margins, reduced to yield rate, and increased process cost.

On comparison, the novel split-gate flash memory cells fabricated from the process disclosed in the present invention exhibit the same or better coupling efficiency between the floating gate and control gate relative to the self-aligned ETOX flash memory cells, while maintaining the same cell dimension and eliminating the over-erase problems that have been associated therewith. These advantages are achieved using the conventional photolithography technique.

In summary, the process disclosed in the present invention contains the following steps:

(a) Depositing a first dielectric layer, such as oxide, polysilicon, or silicon nitride, on a pad oxide layer which had been formed on a substrate. The first dielectric layer can have a thickness ranging from 10 nm to 1 $\mu$m. A photomask region is defined using conventional photolithography technique. The dielectric layer is then etched to reveal a channel region on the substrate which lies below the etched region, or the trench region. The width of the trench region can be from 1 nm to 5 $\mu$m and is formed wider than the width of the control gate to be ultimately formed.

(b) Growing a tunnrl oxide layer having a thickness ranging from 1 nm to 50 nm in the trench region after the steps of growing and etching a sacrificial oxide layer. Thereafter, a first polysilicon layer is deposited covering the first dielectric layer and the tunnel oxide layer. The thickness of the polysilicon layer ranges from 1 nm to 5 $\mu$m.

(c) After the first polysilicon layer is deposited, applying anisotropic etch on the first polysilicon layer to form a pair of opposing polysilicon sidewall spacers on the sidewalls of the first dielectric layer. The polysilicon sidewall spacers cover the end portions of the channel and will eventually form the floating gates of the flash memory cell.

(d) Depositing or growing a gate oxide layer on the polysilicon sidewall spacers and the channel portion between the polysilicon sidewall spacers. This gate oxide layer will ultimately become the inter-poly dielectric layer.

(e) Filling the empty region between the first polysilicon layer (i.e., the pair of polysilicon sidewall spacers with a second polysilicon layer having a thickness from 1 nm to 5 µm; the second polysilicon layer between the polysilicon sidewall spacers will eventually form the control gate.

(f) Using a chemical-mechanical polishing or anisotropic dry etch technique to remove portion of the second polysilicon layer above the surface formed by the first dielectric layer and an outwardly diverging control gate stacked on the pair of matching floating gates and separated by the inter-poly dielectric layer is formed.

(h) Selectively removing the first dielectric layer, leaving the channel area (which includes the control gate and the floating gate) on the substrate. As a result, a fully self-aligned split gate structure is formed.

After the split-gate structure is formed on the substrate, a final oxide layer is then deposited or grown to cap the channel area and a conventional ion implantation technique is applied, using the final oxide layer as a mask, to form source and drain regions, respectively. With this procedure, an improved split-gate flash memory having a pair of floating gates on both sides of control gate is formed which exhibits improved coupling efficiency between floating gate and control gate and eliminates the over-erase problem experienced in the prior are devices without incurring increased cell dimension is obtained using the conventional photolithography technique.

One of the main characteristics of the split-gate flash memory cells fabricated from the process of the present invention is that its control gate has a novel "outwardly diverging" configuration which is stacked on a pair of opposing floating gates, from which the control gate is respectively separated by an inter-poly dielectric layer. The implementation of the pair of opposing floating gates, which also collectively form a mirror-imaged outwardly-diverging configuration, allows the control gate of the flash memory to be formed to have a very short length using conventional photolithography technique. This novel approach allows the size of the split-gate flash memory cell of the present invention to be similar to that of the self-aligned ETOX cells.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 3A–3F are schematic drawings showing the main steps of forming the split-gate flash memory cell according to a preferred embodiment of the present invention.

Figure 3A:
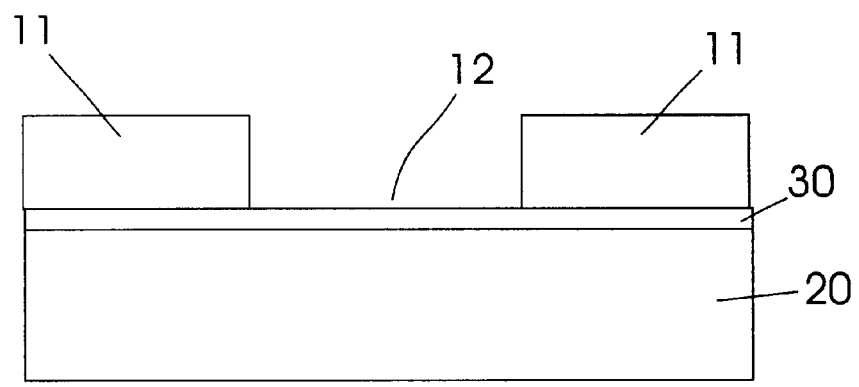
FIGS. 3A–3F are schematic drawings showing the main steps of forming the split-gate flash memory cell according to a preferred embodiment of the present invention.

FIG. 3A is a schematic drawing shows that a first dielectric layer 11 having a trench region 12 which will subsequently define a channel area is formed on the substrate 20 using conventional photolithography technique. FIG. 3A also shows that a pad oxide layer 30 had been formed on the substrate 20. In this step, the first dielectric layer can have a thickness ranging from 10 nm to 1 µm. A photomask region is defined using conventional photolithography technique corresponding to the trench region 12. The dielectric layer is then etched to reveal a channel region which lies below the etched region, or the trench region. The width of the trench region can be from 1 nm to 5 µm and is formed wider than the width of the control gate to be ultimately formed.

Figure 3B:
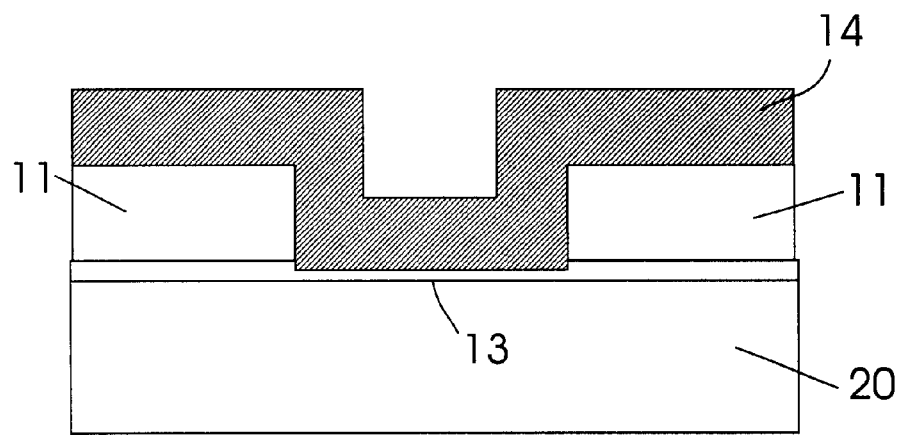

FIG. 3B is a schematic drawing showing that a tunnel oxide layer 13 is grown in the trench region 12, followed by the deposition of a first polysilicon layer 14 which covers the first dielectric layer 11 and the tunnel oxide layer 13. This step involves first growing and etching a sacrificial oxide layer then growing the tunnel oxide layer in the trench region to have a thickness ranging from 1 nm to 50 nm. Thereafter, the first polysilicon layer is deposited covering the first dielectric layer and the tunnel oxide layer. The thickness of the polysilicon layer can range from 1 nm to 5 µm.

Figure 3C:
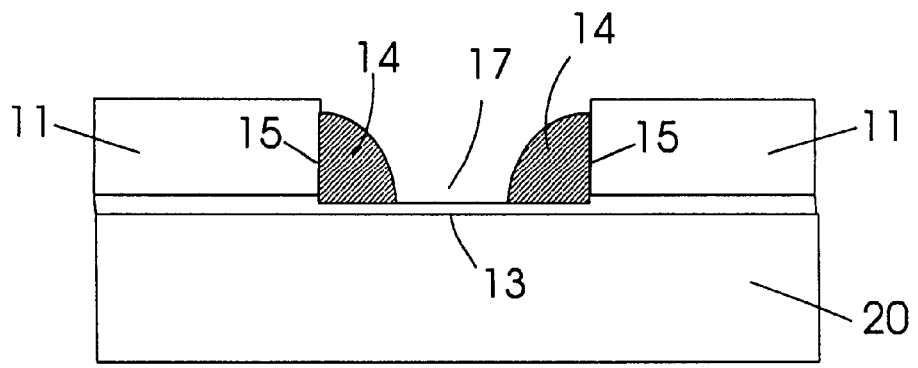

FIG. 3C is a schematic drawing showing that a pair of opposing polysilicon sidewall spacers 14 are formed on the sidewalls 15 of the first polysilicon layer 11 using anisotropic etch technique. The polysilicon sidewall spacers cover the two end portions of the channel and will form the floating gates of the flash memory cell.

Figure 3D:
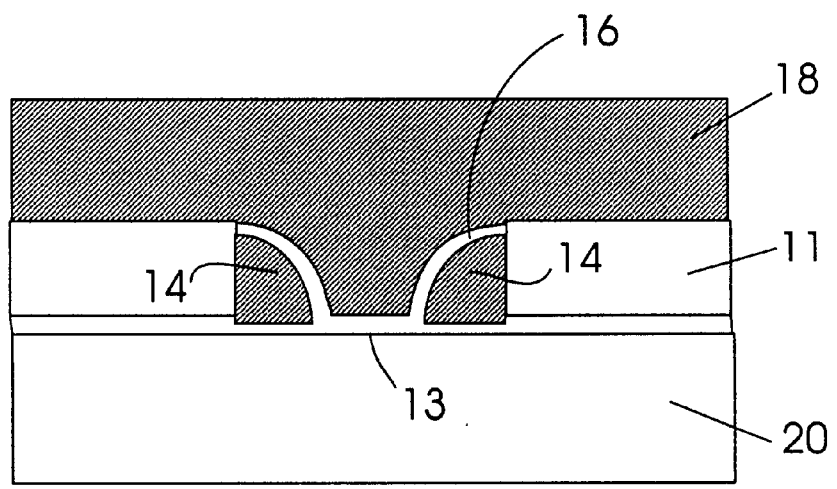

FIG. 3D is a schematic drawing showing that an inter-poly dielectric layer 16 is formed on the polysilicon sidewall spacers 14 and above the portion of the channel area 17 between the polysilicon sidewall spacers 14, followed by the filling of the empty region between the first polysilicon layer (i.e., the pair of polysilicon sidewall spacers) with a second polysilicon layer 18 which will eventually form the control gate. The second polysilicon layer can have a thickness from 1 nm to 5 µm.

Figure 3E:
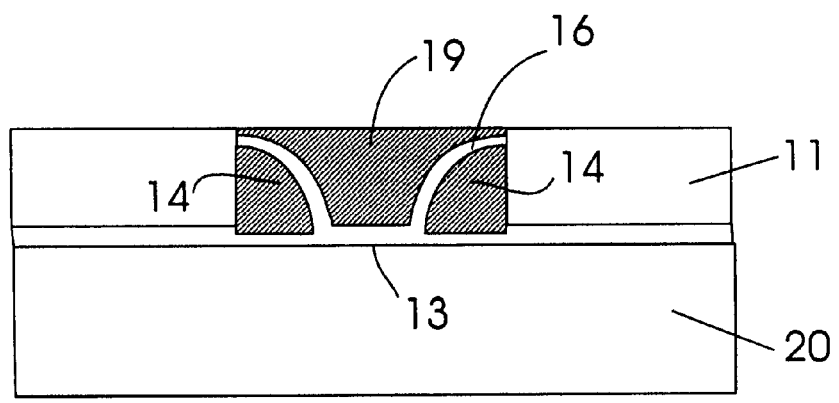

FIG. 3E is a schematic drawing showing that the second polysilicon layer 18 has been planarized to the same height as the first dielectric layer 11 using a chemical-mechanical polishing or anisotropic dry etch technique, leaving an outwardly diverging control gate 19 stacked on the pair of matching floating gates 14 and separated by the inter-poly dielectric layer 16.

Figure 3F:
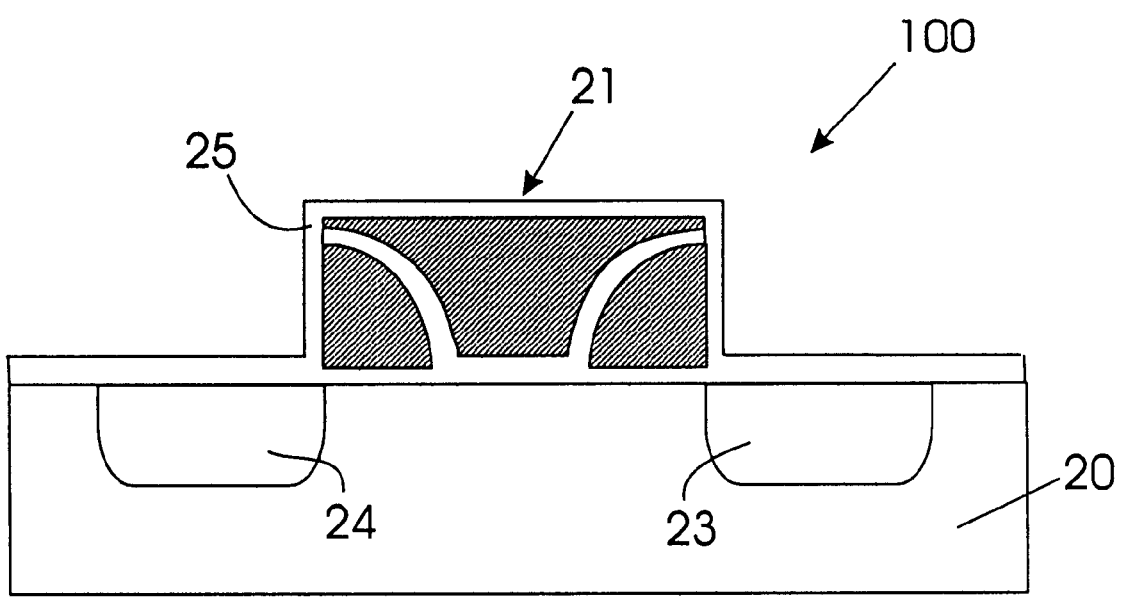

FIG. 3F is a schematic drawing showing that a split-gate flash memory cell 100 of the present invention has been formed by first selectively removing the first dielectric layer 11 and leaving the channel area 21 on the substrate, then a final oxide layer is deposited or grown to cap the channel area 21, and finally a conventional ion implantation technique is applied, using the outermost oxide layer as a mask, to form source 23 and drain 24 regions, respectively. The improved split-gate flash memory of the present invention contains a pair of floating gates on both sides of control gate is formed which exhibits improved coupling efficiency between floating gate and control gate and eliminates the over-erase problem experienced in the prior are devices without incurring increased cell dimension, obtained using the conventional photolithography technique.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for making split-gate semiconductor devices, wherein said split-gate semiconductor devices contain a control gate which is stacked on a pair of opposing floating gates and is separated respectively therefrom by an inter-poly layer, said method comprising the steps of:

(a) obtaining a substrate having a pad oxide layer on top thereof;

(b) forming a first dielectric layer on said substrate, said first dielectric layer having a trench region between two sidewalls of said first dielectric layer;

(c) removing at least a portion said pad oxide layer in said trench region, and forming a tunnel oxide layer in said trench region;

(d) forming a first polysilicon layer covering said first dielectric layer and said tunnel oxide layer;

(e) applying an anisotropic etching technique on said first polysilicon layer to form a pair of opposing polysilicon sidewall spacers adjacent to said sidewalls of said first dielectric layer to become a pair of floating gates, respectively, said pair of opposing polysilicon sidewall spacers collectively define therebetween a channel area above said substrate, wherein said channel area is characterized in that its width generally increases with distance from said substrate;

(f) depositing an inter-poly dielectric layer on said polysilicon sidewall spacers and said tunnel oxide layer;

(g) filling said channel area between said pair of polysilicon sidewall spacers with a second polysilicon layer;

(h) planarizing said second polysilicon layer using a chemical-mechanical polishing technique so that it becomes substantially leveled with said first dielectric layer to form a control gate;

(i) removing said first dielectric layer, capping said control gate and said floating gate with a final oxide layer, and forming source and drain regions in said substrate using ion implantation;

(j) wherein said polysilicon sidewall spacers and said inter-poly dielectric layer are formed such that said inter-poly dielectric layer has a maximum height slightly below said first dielectric layer so as to allow said control gate to be substantially overlaying said floating gates.

2. The method for making split-gate semiconductor devices according to claim 1 wherein said first dielectric layer is formed using a photolithography technique in conjunction with a photoresist.

3. The method for making split-gate semiconductor devices according to claim 1 wherein said first dielectric layer is an oxide layer, a polysilicon layer, or a silicon nitride layer.

4. The method for making split-gate semiconductor devices according to claim 1 wherein said tunnel oxide layer is an oxide layer or a nitride layer.

5. The method for making split-gate semiconductor devices according to claim 1 wherein said second polysilicon layer above said first dielectric layer is removed using a chemical-mechanical polishing technique or an anisotropic dry etch technique.

6. The method for making split-gate semiconductor devices according to claim 1 wherein said trench region is formed which is wider than the design width of said control gate of said split-gate semiconductor.

7. The method for making split-gate semiconductor devices according to claim 1 wherein said trench region has a width ranging from 1 nm and 5 $\mu$m.

* * * * *